(12) United States Patent
Shah et al.

(10) Patent No.: US 9,490,374 B1
(45) Date of Patent: Nov. 8, 2016

(54) RADIATION DETECTORS

(71) Applicant: Radiation Monitoring Devices, Inc., Watertown, MA (US)

(72) Inventors: Kanai S. Shah, Watertown, MA (US); Andrey Gueorguiev, Burlington, MA (US); Leonard Cirignano, Cambridge, MA (US); Hadong Kim, Methuen, MA (US); Alireza Kargar, Watertown, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 13/888,277

(22) Filed: May 6, 2013

Related U.S. Application Data

(60) Provisional application No. 61/642,876, filed on May 4, 2012.

(51) Int. Cl.
*H01L 31/00* (2006.01)
*H01L 31/0224* (2006.01)

(52) U.S. Cl.
CPC .................................. *H01L 31/0224* (2013.01)

(58) Field of Classification Search
CPC ............. H01L 31/0224; H01L 31/032; H01L 31/085; C01G 21/16; C30B 29/12
USPC .......................... 257/431, 428, 449, 453, 459
See application file for complete search history.

(56) References Cited

U.S. PATENT DOCUMENTS

| 4,199,412 | A | * | 4/1980 | Battaglia et al. ............. 205/780 |
| 4,797,190 | A | * | 1/1989 | Peck ....................... G01N 27/40 204/296 |
| 5,641,392 | A | * | 6/1997 | James et al. ................... 205/687 |
| 2007/0023853 | A1 | * | 2/2007 | Partain et al. ................ 257/443 |
| 2009/0108208 | A1 | * | 4/2009 | Yanagita et al. ......... 250/370.01 |
| 2009/0293590 | A1 | * | 12/2009 | Zeng .................... G01N 29/022 73/24.06 |
| 2010/0059742 | A1 | * | 3/2010 | Shieh ................ H01L 21/02554 257/43 |
| 2012/0147447 | A1 | * | 6/2012 | Noh et al. ...................... 359/265 |
| 2013/0033920 | A1 | * | 2/2013 | Strukov et al. ............... 365/148 |
| 2013/0264669 | A1 | * | 10/2013 | Li et al. ........................ 257/431 |

* cited by examiner

*Primary Examiner* — Dung Le
(74) *Attorney, Agent, or Firm* — Wolf, Greenfield & Sacks, P.C.

(57) ABSTRACT

A detector for detecting radiation is generally described. The detector can comprise at least one ionic semiconductor material. For example, the ionic semiconductor material comprises a thallium halide and/or an indium halide. Electrical contacts are formed on the semiconductor material to provide a voltage to the detector during use. At least one of the electrical contacts may comprise a liquid that contains ions. In some instances, at least one electrical contact comprises a metal, such as Cr, Ti, W, Mo, or Pb. In some embodiments, the detector comprises both an electrical contact comprising liquid comprising ions and an electrical contact comprising a metal selected from a group consisting of Cr, Ti, W, Mo, and Pb. Detectors for detecting radiation, as described herein, may have beneficial properties.

18 Claims, 5 Drawing Sheets

A.

B.

RADIATION DETECTORS

RELATED APPLICATIONS

This application claims priority under 35 U.S.C. §119(e) to U.S. Provisional Patent Application Ser. No. 61/642,876, filed May 4, 2012, and entitled "Contacts for TlBr Detectors," which is incorporated herein by reference in its entirety for all purposes.

TECHNICAL FIELD

Detectors and methods for detecting radiation are generally described.

BACKGROUND

Radiation detection is of major interest in a host of applications in nuclear medicine, fundamental physics, industrial gauging, baggage scanners, and oil well logging, amongst others.

Semiconductor detectors, such as silicon avalanche photodiodes (Si-APDs), are widely used for the detection of X-rays, gamma-rays, as well as particles like neutrons, alpha particles etc. Ionic semiconductor detectors can have higher photoelectric and total attenuation coefficients than other semiconductor detectors for gamma-rays. Ionic semiconductor detectors can also operate at room temperature with low dark current in the same manner as other semiconductor detectors. However, ionic semiconductor detectors, such as thallium bromide, generally have not been widely used due performance problems, such as reduced internal field and detector instability, which can result from polarization under applied bias at room temperature. Accordingly, improved detectors and methods are would be useful.

SUMMARY

A detector for detecting radiation is generally described.

In one set of embodiments, a radiation detector comprises an ionic semiconductor material and an electrical contact on the ionic semiconductor material, wherein the electrical contact comprises a liquid comprising ions.

In another set of embodiments, a radiation detector comprises an ionic semiconductor material and an electrical contact on the ionic semiconductor material, wherein the electrical contact comprises at least one layer. In some embodiments, the layer comprises an element selected from the group consisting of Cr, Ti, W, Mo, and Pb and the layer forms substantially the entire interface between the electrical contact and the semiconductor material.

In one set of embodiments, a radiation detector comprises an ionic semiconductor material and an electrical contact on the ionic semiconductor material, wherein the electrical contact comprises at least one layer. In some embodiments, the layer comprises an element selected from the group consisting of Cr, Ti, W, Mo, and Pb, and the thickness of the layer is greater than or equal to about 40 nm.

In another set of embodiments, a radiation detector comprises an ionic semiconductor material and an electrical contact on the ionic semiconductor material, wherein the electrical contact comprises a metal selected from the group consisting of Cr, Ti, W, Mo, and Pb. In some embodiments, the detector has a stability of greater than or equal to about 5 days at room temperature under continuous bias of 100 V/mm.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

A detector for detecting radiation is generally described. The detector can comprise at least one ionic semiconductor material. For example, the ionic semiconductor material comprises a thallium halide (e.g., TlBr) and/or an indium halide. Electrical contacts are formed on the semiconductor material to provide a voltage to the detector during use. At least one of the electrical contacts may comprise a liquid that contains ions. For example, the liquid comprises ions capable of associating with an ionic species originating from the ionic semiconductor material. In some instances, at least one electrical contact comprises a metal, such as Cr, Ti, W, Mo, or Pb. In some embodiments, the detector comprises both an electrical contact comprising liquid comprising ions and an electrical contact comprising a metal selected from the group consisting of Cr, Ti, W, Mo, and Pb. Detectors for detecting radiation, as described herein, may have beneficial properties, such as enhanced stability, sensitivity, and efficiency, amongst others.

Figure 1:
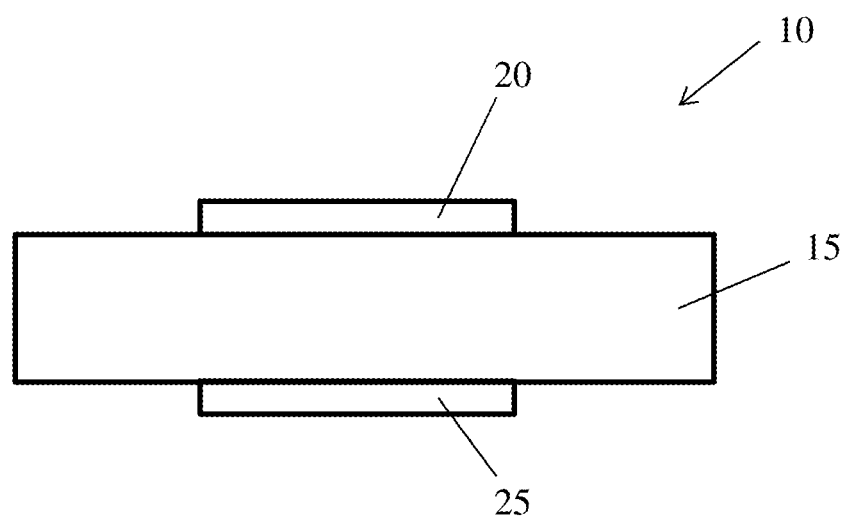
FIG. 1 illustrates a detector, according to one set of embodiments.

As shown in FIG. 1, a detector 10 for detecting radiation may comprise an ionic semiconductor material 15. At least one electrical contact may be positioned on, directly or indirectly, the ionic semiconductor material, such that the ionic semiconductor material is in electrical communication with the electrical contact. In some instances, the detector comprises two or more electrical contacts (e.g., 20 and 25) as shown in FIG. 1.

In some cases, an electrical contact on the ionic semiconductor material is the same as another electrical contact on the ionic semiconductor material. In certain cases, an electrical contact on the ionic semiconductor material is different than another electrical detector on the ionic semiconductor material. In one example, an electrical contact comprising Cr and an electrical contact comprising a liquid comprising halide ions are positioned on the ionic semiconductor material.

As mentioned above, a detector for detecting radiation includes an ionic semiconductor material. In general, any suitable ionic semiconductor material may be used. In some embodiments, the ionic semiconductor material comprises thallium. The ionic semiconductor material may comprise one or more thallium compounds (e.g., two, three, four). In some instances, one or more thallium compounds in the ionic semiconductor material may be a thallium halide. That is, a compound of thallium and one or more halide element. For example, the ionic semiconductor material may comprise thallium bromide, thallium iodide, thallium chloride, thallium fluoride, thallium bromochloride, thallium bromoiodide, or combinations thereof.

In some embodiments, the ionic semiconductor material comprises indium. The ionic semiconductor material may comprise one or more indium compounds (e.g., two, three, four). In some instances, one or more indium compounds in the ionic semiconductor material may be an indium halide. That is, a compound of indium and one or more halide element. For example, the ionic semiconductor material may comprise indium bromide, indium iodide, indium chloride, indium fluoride, indium bromochloride, indium bromoiodide, or combinations thereof.

In some embodiments, the ionic semiconductor material comprises thallium and indium. For example, the ionic semiconductor material may comprise at least one thallium compound and at least one indium compound. Those of ordinary skill in the art would be knowledgeable of suitable ionic semiconductor materials for use in a radiation detector, including those comprising thallium and/or indium.

In some embodiments, the ionic semiconductor material may be relatively thick. For instance, in some embodiments, the ionic semiconductor material has a thickness of greater than or equal to about 0.5 mm, greater than or equal to about 1 mm, greater than or equal to about 5 mm, greater than or equal to about 10 mm, or greater than or equal to 15 mm. In some instance, the ionic semiconductor material has a thickness of less than or equal to about 20 mm, less than or equal to about 15 mm, less than or equal to about 10 mm, or less than or equal to about 5 mm. It should be understood that all combinations of the above-referenced ranges are also possible (e.g., greater than or equal to about 5 mm and less than or equal to about 20 mm).

As described herein, electrical contacts are formed on the semiconductor material to provide a voltage on the detector during use. In some embodiments, certain ionic semiconductor materials may comprise ionic species that move in response to an applied voltage. In some such cases, certain ionic species may move toward an electrical contact. In certain instances, the ionic species move until they are associated (e.g., via a chemical bond, via physical proximity) with the at least a portion of the electrical contact. In some cases, the ionic species may accumulate at or near at least a portion of theelectrical contact.

In some embodiments, an electrical contact on the ionic semiconductor comprises a liquid. The liquid may comprise ions that are capable of associating with ionic species originating from the ionic semiconductor material. The ions in the liquid and the ionic species originating from the ionic semiconductor material may associate via a chemical interaction, such as a chemical bond (e.g., covalent bond, non-covalent bond). In some instances, the ions in the liquid (e.g., halide ions) and the ionic species originating (e.g., thallium ions, indium ions) from the ionic semiconductor material may associate to form new ionic semiconductor material (e.g., a thallium, halide, indium halide) and/or ionic compounds. In some embodiments, the association between the ions in the liquid and the ionic species originating from the ionic semiconductor material can overcome one or more problems (e.g., reduced equivalent internal field, reduced charge collection efficiency, damaged electrical contact, limited operating conditions, limited lifetime) which may otherwise be associated with the movement of certain ionic species in the ionic semiconductor material. Without wishing to be bound by theory, it is believed that the association between ions in the liquid and the ionic species prevent or mitigate the association of certain ionic species with the electrical contact and/or accumulation of certain ionic species at or near the interface between the ionic semiconductor material and the electrical contact.

Figure 2:
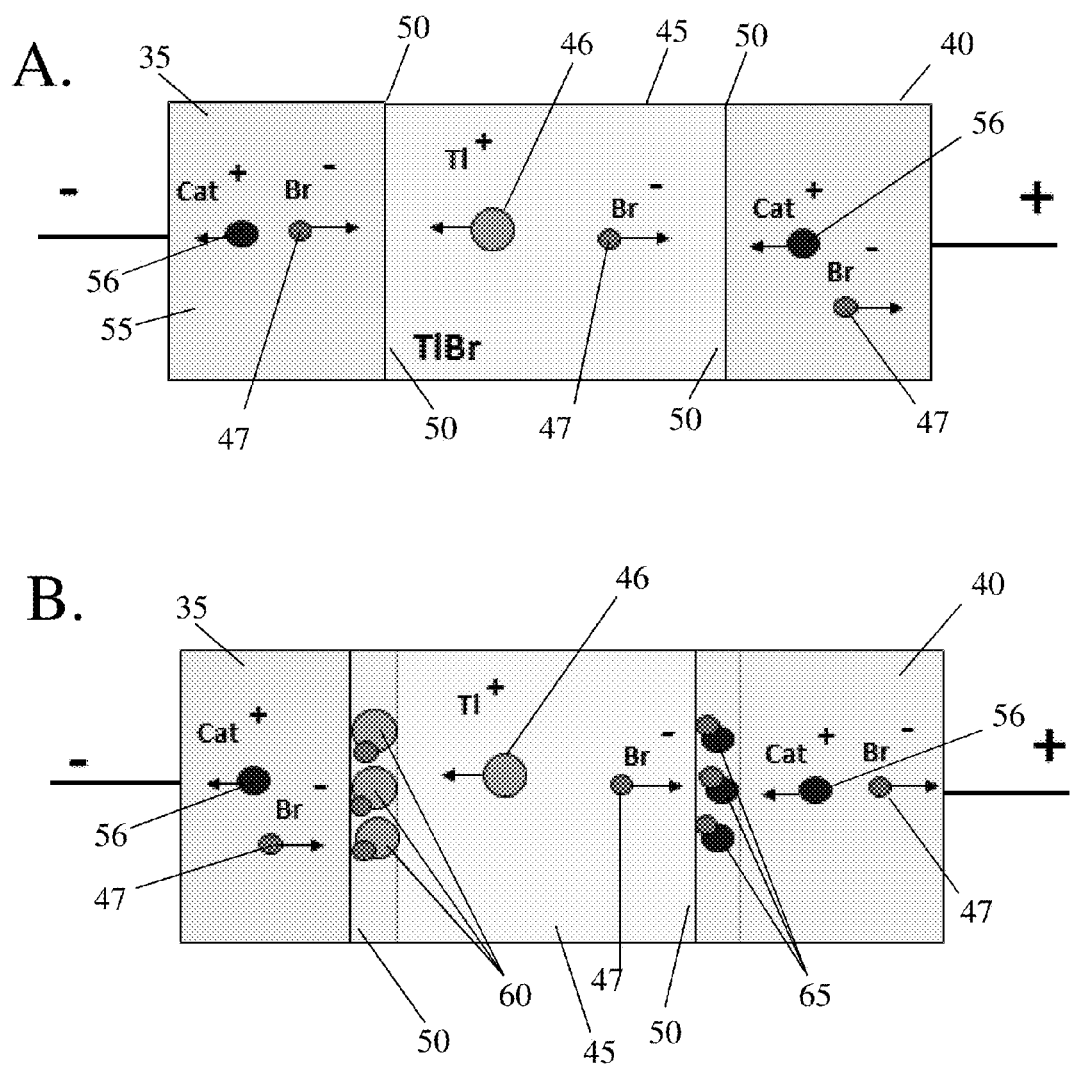
FIG. 2A-B illustrate detectors during use, according to certain embodiments.

For example, as illustrated in FIG. 2A-B, a detector 30 comprises a first electrical contact 35, a second electrical contact 40, and an ionic semiconductor material 45 that comprises thallium bromide. The ionic semiconductor material may contain thallium ions 46 and bromide ions 47. The first and second electrical contacts comprise a liquid 55 that contains cations (e.g., sodium, potassium, ammonium) 56 and bromide ions as illustrated in FIG. 2A. Under voltage, the thallium and bromide ions in the ionic semiconductor material move based on polarity, such that the thallium and bromide ions travel toward the first and second electrical contacts, respectively. The cations and bromide ions in the electrical contact also move based on polarity as illustrated in FIG. 2A. In the first electrical contact, the cations move toward the negative potential and the bromide ions move toward the ionic semiconductor material. In the second electrical contact, the cations move toward the ionic semiconductor material and the bromide ions move toward the positive potential. As illustrated in FIG. 2B, the ionic species that are present at or near the interfaces 50 between the electrical contacts and the ionic semiconductor material may associate with ions in the liquid that are present at or near the interfaces. Thallium ions at or near the first electrical contact may associate with bromide ions from the liquid to form new thallium bromide 60 (e.g., in the solid state). Bromide ions originating from the ionic semiconductor material and cations in the second electrical contact may associate to from new compounds 65. The association of ions from the liquid and ionic species from the ionic semiconductor material may prevent the accumulation of ionic species at the interfaces, which can reduce the internal electrical field of the ionic semiconductor material.

In general, the ions in the liquid may be selected as desired. In some embodiments, the ions in the liquid are capable of associating with certain ionic species originating from the ionic semiconductor material, as described herein. In certain embodiments, the ions in the liquid and the ionic species from the ionic semiconductor material may associate to from a solid or dissolved compound. In one example, halide ions in the liquid may form a chemical bond with a thallium and/or indium ions from the ionic semiconductor material. The newly formed thallium halide and/or indium halide compounds may be present in solid form or dissolved in solution. In another example, inorganic cations (e.g., $Na^+$, $K^+$, $Cs^+$, $NH_4^+$) in the liquid may associate with anions (e.g., halide ions) from the ionic semiconductor material.

In some embodiments, one or more ions (e.g., an anion) in the liquid is selected to be the same or to have similar chemical properties as a certain ionic species (e.g., an anion) in the ionic semiconductor material. For example, in embodiments in which the ionic semiconductor material is thallium bromide, the liquid includes bromide ions and/or other halide ions. In certain embodiments, one or more ions in the liquid is selected based on the ability to produce compounds (e.g., via association with ionic species from the semiconductor material) that are the same or have similar chemical properties as a compound in the ionic semiconductor material. In some such cases, the newly formed compound may be in close proximity to or in direct contact with at least a portion of the ionic semiconductor material. In one example in which the ionic semiconductor material is thallium bromochloride, the liquid contains bromide and chloride ions that associate with thallium ions from the ionic semiconductor material to produce newly formed thallium bromochloride on at least a portion of the surface of the ionic semiconductor material.

In some embodiments, one or more ions in the liquid is selected to prevent accumulation of charge at or near the interface between the electrical contact and the ionic semiconductor material. The liquid may contain one or more ions capable of associating with an ionic species that accumulate at the interface. For example, the liquid may include organic and/or inorganic cations that form ionic compounds with anions from the ionic semiconductor material.

Non-limiting examples of ions that a liquid may comprise include inorganic ions (e.g., sodium, ammonium, potassium, cesium, halides), organic ions (e.g., molecules with a molecular weight greater than about 100 g/mol, $C_{10}H_{19}N_2$—Br, $C_{10}H_{19}N_2$—Cl, $C_{12}H_{23}N_2$—Br, $C_{12}H_{23}N_2$—Cl), and combinations thereof. In one example, a liquid comprises one or more organic cations and one or more inorganic anions (e.g., halide ion). In another example, a liquid comprises one or more inorganic cations and one or more inorganic anions (e.g., halide ion). In general, an electrical contact comprising a liquid may comprise any suitable number of inorganic and/or organic ions.

Those of ordinary skill in the art would be able to select suitable ions for an electrical contact comprising a liquid based on knowledge in the art and the description herein.

Any suitable liquid may be used in the electrical contact. In some embodiments, the liquid comprises water, a non-aqueous solvent, an organic solvent, or combinations thereof. Non-limiting examples of organic solvents include methanol, aliphatic alcohols, aromatic alcohols, and combinations thereof. In some embodiments, an electrical contact may comprise an alcohol, such as methanol.

In general, the liquid comprising ions may be sufficiently conductive. The conductivity of the liquid may be measured using resistivity and may be on the order of, e.g., about 1 kΩ/cm. It should be understood that the liquid can have any suitable conductivity.

In some embodiments, the pH of a liquid in an electrical contact is selected to not adversely affect the ionic semiconductor material. For example, the pH of the liquid is between 6 and 8 (e.g., 7).

In some embodiments, an electrical contact comprises a metal that can prevent and/or mitigate one or more problems (e.g., damaged electrical contact, limited operating conditions, limited lifetime) associated with the movement of certain ionic species in the ionic semiconductor material. In certain embodiments, the electrical contact comprises at least one layer. The layer may comprise an element selected from the group consisting of Cr, Ti, W, Mo, and Pb. It should be understood that the electrical contact may include additional layers, formed of Au or other precious metals.

Without wishing to be bound by theory, it is believed that an electrical contact comprising a certain thickness and/or placement of a certain metal is resistant to the association with and/or accumulation of certain ionic species that adversely affect the detector. For example, in some instances, Cr, Ti, W, Mo, Pb, or combinations thereof are resistant to association with certain ionic species originating from the ionic semiconductor material. In another example, an electrical contact comprises at least one layer of a metal selected from the group consisting of Cr, Ti, W, Mo, and Pb and at least one additional layer of another metal (e.g., Au, other precious metals). The electrical contact may be resistant to association with ionic species when the layer of metal selected from a group consisting of Cr, Ti, W, Mo, and Pb forms substantially the entire interface between the electrical contact and the ionic semiconductor material. Detectors comprising one or more electrical contacts with an approximate thickness and/or placement of Cr, Ti, W, Mo, Pb, or combinations thereof may have enhanced stability and/or reduced damage to an electrical contact due to the movement of certain ionic species in the ionic semiconductor material.

As described herein, a detector for detecting radiation may comprise an electrical contact that comprises a metal selected from the group consisting of Cr, Ti, W, Mo, and Pb. In certain embodiments, an electrical contact comprises a layer of a metal selected from the group consisting of Cr, Ti, W, Mo, and Pb. In some embodiments, an electrical contact on the ionic semiconductor material comprises Cr. It may be preferable for the layer of the electrical contact to comprise Cr (e.g., greater than 50 wt. % Cr, greater than 75 wt. % Cr, greater than 95 wt. % Cr).

In some embodiments, the thickness of Cr, Ti, W, Mo, Pb, or combinations thereof layer in the electrical contact is greater than or equal to about 40 nm, greater than or equal to about 60 nm, greater than or equal to about 80 nm, greater than or equal to about 100 nm, greater than or equal to about 200 nm, greater than or equal to about 500 nm, or greater than or equal to about 750 nm. In some instance, the thickness of Cr, Ti, W, Mo, Pb, or combinations thereof layer in the electrical contact is less than or equal to about 1,000 nm, less than or equal to about 750 nm, less than or equal to about 500 nm, less than or equal to about 250 nm, or less than or equal to about 100 nm. It should be understood that all combinations of the above-referenced ranges are also possible (e.g., greater than or equal to about 40 nm and less than or equal to about 100 nm).

As described herein, detectors for detecting radiation may have beneficial properties, such as enhanced stability, charge collection efficiency, and/or advantageous operating conditions. In some embodiments, a detector comprising an ionic semiconductor material and at least one electrical contact, described herein, has a greater stability than a detector comprising an equivalent ionic semiconductor material but different electrical contacts. As used herein, stability refers to the number of days that the coefficient of variation of the peak position (i.e., peak centroid location) on a pulse height spectra acquired using the detector at room temperature under continuous bias at 100 V/mm (e.g., with a 60 keV gamma source) is less than or equal to about 10% (e.g., less than or equal to about 8%, less than or equal to about 5%, less than or equal to about 3%, or less than or equal to about 1%). A detector comprising an ionic semiconductor material and at least one electrical contact, described herein, may have enhanced stability (i.e., no polarization, little polarization) over a relatively long period of time.

In some embodiments, the stability of a detector, described herein, is greater than or equal to about 5 days, greater than or equal to about 15 days, greater than or equal to about 25 days, greater than or equal to about 50 days, greater than or equal to about 75 days, greater than or equal to about 100 days, greater than or equal to about 125 days, greater than or equal to about 150 days, or greater than or equal to about 175 days. In some instances, the stability of a detector, described herein, is between about 25 days and about 200 days or between about 50 days and about 200 days.

In some embodiments, a detector comprising an ionic semiconductor material and at least one electrical contact, described herein, has an enhanced charge collection and accordingly detector efficiency. The detector may exhibit improved detector efficiency over a relatively long period of time. In some instances, the improved detector efficiency has the same time scale as the stability. In some embodiment, detector, described herein, may be relatively stable at higher temperatures (e.g., room temperature) than conventional ionic semiconductor materials.

Figure 3:
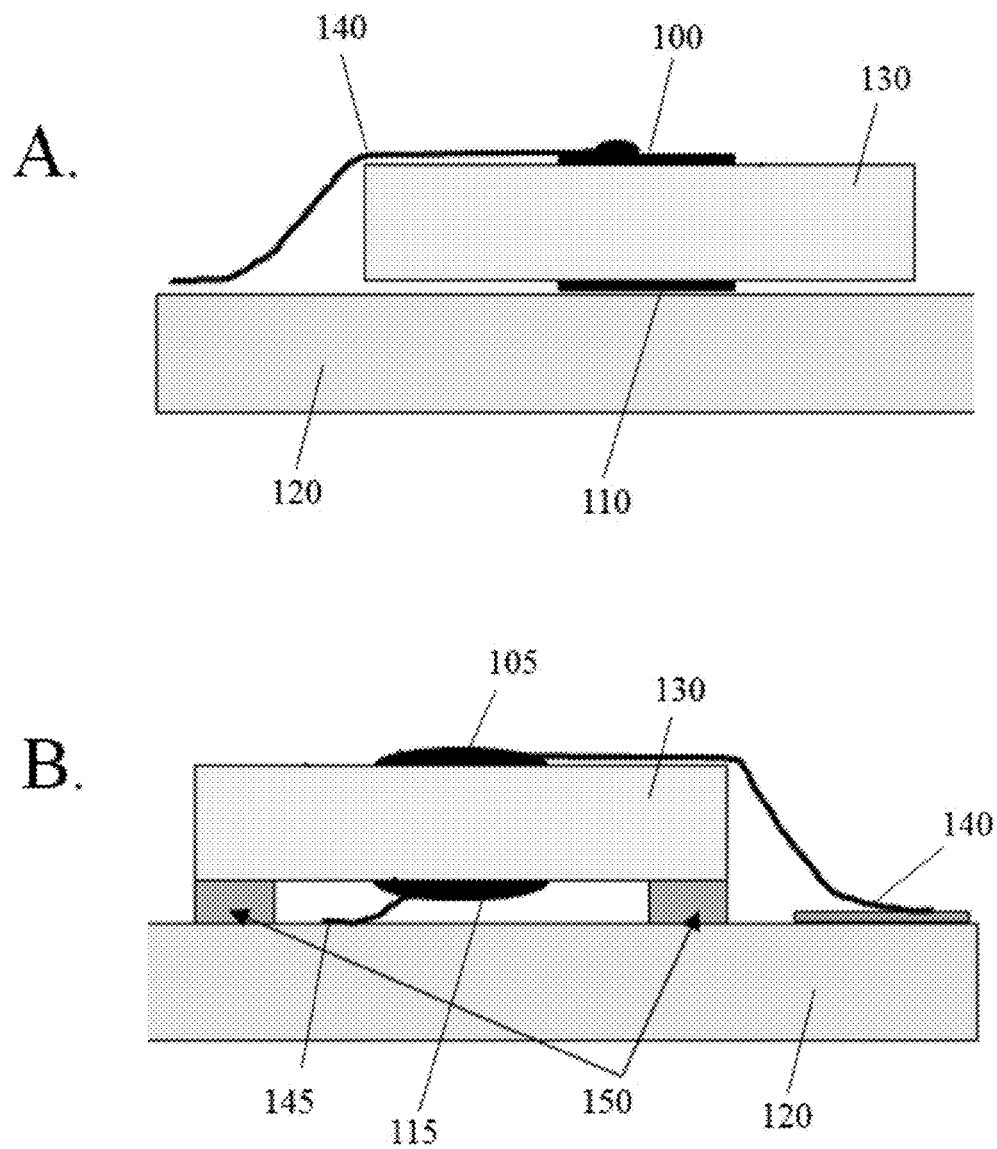
FIG. 3A-B illustrate detectors, according to certain embodiments.

As mentioned above, a detector for detecting radiation may include an ionic semiconductor material and at least one electrical contact. In some embodiments, the detector may also include other components. Non-limiting example of detectors according to certain embodiments can be seen in FIG. 3A-B. As shown in FIG. 3A, in some instances, a detector includes two electrical contacts 100 and 110 comprises a metal selected from the group consisting of Cr, Ti, W, Mo, and Pb on the ionic semiconductor material. The two electrical contacts may serve as a cathode and anode for the detector. In some instances, at least a portion of electrical contacts are in direct physical contact with the ionic semiconductor material. The detector may also comprise a substrate 120 that supports the ionic semiconductor material 130. At least one electrical contact may be connected to a voltage source via a wire 140, as illustrated in FIG. 3A.

In some embodiments, as illustrated in FIG. 3B, a detector includes two electrical contacts 105 and 115 comprising liquids that comprise ions, on the ionic semiconductor material. In some instances, at least a portion of electrical contacts are in direct physical contact with the ionic semiconductor material. The detector may also comprise a substrate 120 that supports the ionic semiconductor material 130. At least one electrical contact may be connected to the substrate via a wire and 145, as illustrated in FIG. 3A.

In some embodiments, as illustrated in FIG. 3B, the ionic semiconductor material and electrical contacts may be attached to a substrate 120 via a holder 150. The holder may prevent a liquid from contacting the substrate, e.g., to ensure confinement to a fixed location and or prevent adverse interactions between the liquid and the substrate. In some instances, the liquid may be in electrical communication with a voltage source via wires 140 and 145.

In some embodiments, the detector comprises structures to confine the electrical contacts comprising liquids to a specific location on the ionic semiconductor material. For example, the detector may comprise a mechanical barrier. Those of ordinary skill in the art would be knowledgeable of suitable mechanical barriers to confine a liquid to a certain area on a material.

In certain embodiments, the electrical contact may be constructed, such that the liquid remains at a specific location on the ionic semiconductor material. In some instances, the liquid may be combined with a substance that alters (e.g., lowers) the interfacial tension between the liquid and the semiconductor material. In some cases, the liquid may be combined with a substance that alters the viscosity of the liquid. In some examples, the liquid may be combined with a substance (e.g., glycerol, glycerin) to form a gel. The viscosity of the gel may allow the electrical contact comprising a liquid to remain in a specific location. Those of ordinary skill in the art would be knowledgeable of substances that can be added to a liquid to alter the interfacial tension and viscosity, amongst other properties.

It should be understood that the electrical contact comprising liquid is constructed to not adversely affect the function of the ionic semiconductor material (e.g., dissolve at least a portion of the ionic semiconductor material, diffuse into the ionic semiconductor material) and the detector. Those of ordinary skill in the art would be knowledgeable of substances that can be included in the electrical contact without adversely affecting the function of the electrical contact and the detector.

In some embodiments, a detector (not shown) may include an ionic semiconductor material, an electrical contact comprising a metal selected from a group consisting of Cr, Ti, W, Mo, and Pb (e.g., Cr) and an electrical contact comprising a liquid comprising ions. In some such cases, the electrical contact comprising a metal selected from the group consisting of Cr, Ti, W, Mo, and Pb (e.g., Cr) may serve as a cathode and the electrical contact comprising a liquid may serve as an anode. In some instances, the electrical contact comprising a metal selected from the group consisting of Cr, Ti, W, Mo, and Pb (e.g., Cr) may serve as an anode and the electrical contact comprising liquid may serve as cathode. In general, in embodiments in which an electrical contact comprises a metal selected from the group consisting of Cr, Ti, W, Mo, and Pb (e.g., Cr) is an anode, specialized anode structures (e.g., pixelated array detector, coplanar greater detector) can be formed.

In general, the electrical contact may be formed by any suitable method known to those of skill in the art. In some embodiments, an electrical contact comprising one or more metal may be deposited on at least a portion (e.g., surface) of the ionic semiconductor material. For example, the electrical contact may be sputtered, evaporated, or deposited on the ionic semiconductor material by any other known deposition technique. In certain embodiments, an electrical contact comprising a liquid may be deposited and confined to a fixed location on the ionic semiconductor material using any suitable technique known to those of skill in the art. For instance, the liquid may be dispensed on at least a portion of the ionic semiconductor material and confined by structural barrier (e.g. holder, coverslip) and/or via the interfacial tension.

It should be understood that the detectors, as described herein, can be used to detect gamma radiation. A method for detecting radiation may comprise providing a detector, as described herein, exposing the detector to gamma radiation, and generating an electrical signal. In some instances, the presence or absence of gamma radiation may be determined by the presence or absence, respectively, of an electrical signal.

The following examples are intended to illustrate certain embodiments of the present invention, but do not exemplify the full scope of the invention.

EXAMPLES

Example 1

This example describes the stability of electrical contacts comprising liquids. The electrical contacts had no visible damage after 100 days under a continuous bias of 100 V/mm. Moreover, the detector did not exhibit a shift in peak position for more than 14 days under a continuous bias of 100 V/mm.

A radiation detector containing thallium bromide ingot and two electrical contacts containing NH$_4$Br in methanol were formed. The resulting solution was mixed with glycerol to form a gel. The gel was then pipetted onto the thallium bromide ingot. Pd wires were contacted to the electrical contacts and a substrate to for a detector.

A pulse height spectra was acquired using the detector at room temperature under continuous bias at 100 V/mm with $^{41}$Am as the gamma radiation source. The detector had a constant peak position (i.e., no polarization) for more than 14 days of use. In addition, the electrical contacts showed no visible signs of damage after 100 days.

Comparative Example 1

Figure 4:
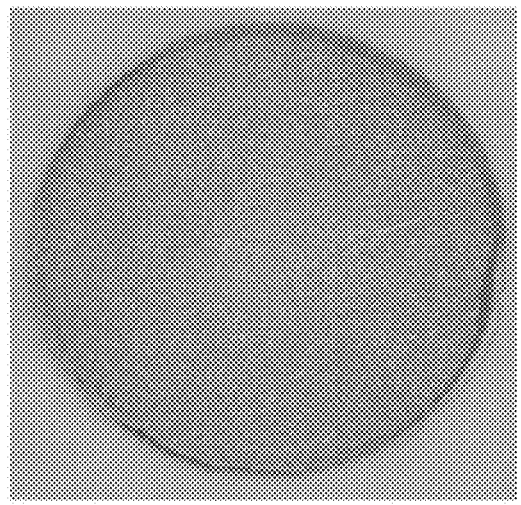
FIG. 4A-B illustrate a gold electrical contact (A) before and (B) after use, according to one set of embodiments.
Figure 4:
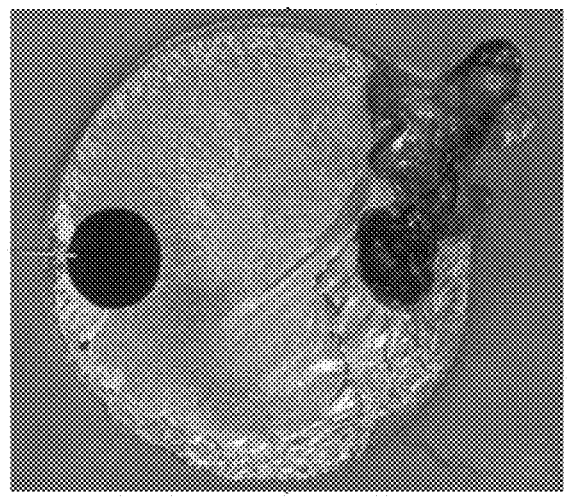

A detector was formed and tested using the same procedures as Example 1, except the electrical contacts were gold and were sputtered onto the thallium bromide. As shown in FIG. 4, the gold electrical contact was damaged after 4 days of use at room temperature under continuous bias at 100 V/mm with $^{41}$Am as the gamma radiation source. FIG. 4A shows the gold electrical contact after deposition and FIG. 4B shows the gold electrical contact after 4 days of use.

Example 2

This example describes the detectors with Cr electrical contacts. The detector contained thallium bromide and chrome electrical contacts and exhibited good charge collection properties.

Figure 5:
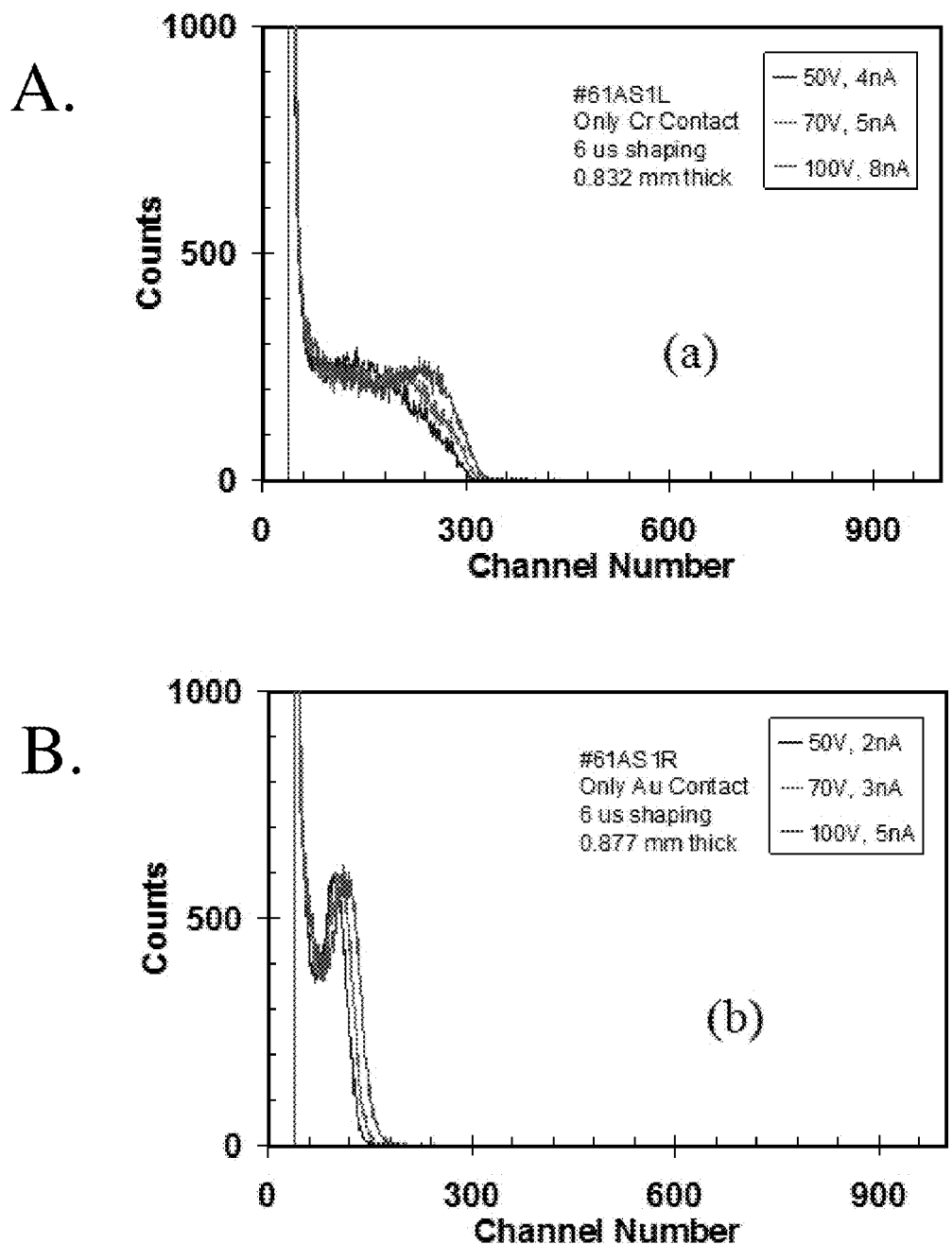
FIG. 5A-B illustrate (A) a pulse height spectra for a Cr/TlBr/Cr detector and (B) a pulse height spectra for a Au/TlBr/Au detector.

TlBr ingot with a thickness of about 0.8 mm was used as the ionic semiconductor material. The TlBr was lapped with 24 µm grains, then polished with 3 µm grains, and etched with fresh 5% Br in MeOH. Cr electrical contacts with a 3 mm diameter were deposited on the ionic semiconductor material. The Cr electrical contacts were annealed at 150° C. for 24 hours in Argon atmosphere after deposition. The TlBr with deposited Cr (i.e., Cr/TlBr/Cr) was mounted to a ceramic substrate and $^{241}$Am (60 keV) pulse height spectra were acquired. FIG. 5A shows the pulse height spectra of the Cr/TlBr/Cr detector at different biases. As illustrated by the spectra, the Cr/TlBr/Cr detector had good charge collection.

Comparative Example 2

A detector was formed and tested using the same procedures as Example 2, except the electrical contacts were gold. The Au/TlBr/Au detector exhibited a lower charge collection efficiency than the detector in Example 2, as illustrated by FIG. 5B. FIG. 5B shows the pulse height spectra of the Au/TlBr/Au detector at different biases.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed.

What is claimed is:

1. A radiation detector, comprising:
   an ionic semiconductor material; and
   an electrical contact on the ionic semiconductor material, wherein the electrical contact comprises a liquid comprising ions.
2. The radiation detector of claim 1, wherein the ionic semiconductor material comprise Tl and/or In.
3. The radiation detector of claim 1, wherein the ionic semiconductor material comprises a halide.
4. The radiation detector of claim 1, wherein the detector has a stability of greater than or equal to about 5 days at room temperature under continuous bias of 100 V/mm.
5. The radiation detector of claim 1, wherein the electrical contact is a cathode.
6. The radiation detector of claim 1, further comprising an electrical contact comprising a metal selected from the group consisting of Cr, Ti, W, Mo, and Pb.
7. The radiation detector of claim 6, wherein the electrical contact comprises first layer comprising the metal.
8. The radiation detector of claim 7, wherein the electrical contact comprises a second layer comprising a precious metal.
9. The radiation detector of claim 6, wherein the electrical contact is an anode.
10. The radiation detector of claim 1, wherein the liquid comprises halide ions.
11. The radiation detector of claim 1, wherein the liquid comprises organic cations.
12. The radiation detector of claim 1, wherein the liquid comprises ions capable of associating with an ionic species originating from the ionic semiconductor material.
13. The radiation detector of claim 1, wherein the liquid comprises ions capable of forming a compound with an ionic species originating from the ionic semiconductor material.
14. The radiation detector of claim 13, wherein the compound is a thallium halide.
15. The radiation detector of claim 13, wherein the compound is an indium halide.
16. The radiation detector of claims 12 and 13, wherein the ionic species is Tl and/or In ions.
17. The radiation detector of claim 1, wherein the electrical contact is a gel.
18. The radiation detector of claim 1, wherein the liquid is confined to a specific location on the ionic semiconductor material.

* * * * *